United States Patent
Ko et al.

(10) Patent No.: US 9,159,673 B2
(45) Date of Patent: Oct. 13, 2015

(54) FORMING INTERCONNECT STRUCTURES USING PRE-INK-PRINTED SHEETS

(71) Applicant: Taiwan Semiconductor Manufacturing Company, Ltd., Hsin-Chu (TW)

(72) Inventors: Jung Cheng Ko, Taichung (TW); Chi-Chun Hsieh, Tongluo Township (TW); Shang-Yun Hou, Jubei (TW); Wen-Chih Chiou, Zhunan Township (TW); Shin-Puu Jeng, Hsin-Chu (TW); Chen-Hua Yu, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 14/204,722

(22) Filed: Mar. 11, 2014

(65) Prior Publication Data

US 2014/0191395 A1 Jul. 10, 2014

Related U.S. Application Data

(62) Division of application No. 12/778,867, filed on May 12, 2010, now Pat. No. 8,716,867.

(51) Int. Cl.
*H01L 23/538* (2006.01)
*H01L 21/768* (2006.01)
(Continued)

(52) U.S. Cl.
CPC ...... *H01L 23/5384* (2013.01); *H01L 21/76898* (2013.01); *H01L 23/147* (2013.01); *H01L 23/481* (2013.01); *H01L 23/49822* (2013.01); *H01L 23/49827* (2013.01); *H01L 23/49883* (2013.01); *H01L 23/5328* (2013.01); *H01L 23/525* (2013.01); *H01L 24/05* (2013.01); *H01L 24/13* (2013.01); *H01L 24/14* (2013.01);
(Continued)

(58) Field of Classification Search
CPC .................................................. H01L 23/5384
USPC ........... 257/737, 774, 762, 701, 693; 438/117
See application file for complete search history.

(56) References Cited

U.S. PATENT DOCUMENTS

| 4,727,633 A | 3/1988 | Herrick |
| 4,811,082 A | 3/1989 | Jacobs et al. |

(Continued)

FOREIGN PATENT DOCUMENTS

| JP | 2005159074 A | 6/2005 |
| JP | 2008034358 A | 2/2008 |

OTHER PUBLICATIONS

"New Nanosilver Ink Developed for Printed Electronics," Nanowerk News, http://www.nanowerk.com/new/newsid=9261.php, posted Feb. 12, 2009, 2 pages.

(Continued)

*Primary Examiner* — Sheng Zhu
(74) *Attorney, Agent, or Firm* — Slater & Matsil, L.L.P.

(57) ABSTRACT

A method of forming a device includes printing conductive patterns on a dielectric sheet to form a pre-ink-printed sheet, and bonding the pre-ink-printed sheet onto a side of a substrate. The conductive feature includes a through-substrate via extending from a first major side of the substrate to a second major side of the substrate opposite the first major side. A conductive paste is then applied to electrically couple conductive patterns to a conductive feature in the substrate.

19 Claims, 11 Drawing Sheets

(51) Int. Cl.
*H01L 23/14* (2006.01)
*H01L 23/48* (2006.01)
*H01L 23/498* (2006.01)
*H01L 23/532* (2006.01)
H01L 23/525 (2006.01)
H01L 23/00 (2006.01)

(52) U.S. Cl.
CPC .......... *H01L2224/0401* (2013.01); *H01L 2224/05572* (2013.01); *H01L 2224/13009* (2013.01); *H01L 2224/13147* (2013.01); *H01L 2224/13644* (2013.01); *H01L 2224/13655* (2013.01); *H01L 2224/14181* (2013.01); *H01L 2924/0002* (2013.01); *H01L 2924/00014* (2013.01)

(56) References Cited

U.S. PATENT DOCUMENTS

| | | | |
|---|---|---|---|
| 4,990,462 A | 2/1991 | Sliwa, Jr. | |
| 5,075,253 A | 12/1991 | Sliwa, Jr. | |
| 5,117,069 A | 5/1992 | Higgins, III | |
| 5,227,588 A | 7/1993 | Schreiber et al. | |
| 5,380,681 A | 1/1995 | Hsu | |
| 5,481,133 A | 1/1996 | Hsu | |
| 5,497,545 A * | 3/1996 | Watanabe et al. | 29/830 |
| 5,747,222 A | 5/1998 | Ryu | |
| 5,972,482 A | 10/1999 | Hatakeyama et al. | |
| 6,002,177 A | 12/1999 | Gaynes et al. | |
| 6,139,777 A | 10/2000 | Omoya et al. | |
| 6,187,678 B1 | 2/2001 | Gaynes et al. | |
| 6,229,216 B1 | 5/2001 | Ma et al. | |
| 6,236,115 B1 | 5/2001 | Gaynes et al. | |
| 6,271,059 B1 | 8/2001 | Bertin et al. | |
| 6,279,815 B1 | 8/2001 | Correia et al. | |
| 6,353,540 B1 * | 3/2002 | Akiba et al. | 361/794 |
| 6,355,501 B1 | 3/2002 | Fung et al. | |
| 6,384,344 B1 | 5/2002 | Asai et al. | |
| 6,384,485 B1 | 5/2002 | Matsushima | |
| 6,434,016 B2 | 8/2002 | Zeng et al. | |
| 6,448,661 B1 | 9/2002 | Kim et al. | |
| 6,461,895 B1 | 10/2002 | Liang et al. | |
| 6,562,623 B1 | 5/2003 | Ma et al. | |
| 6,570,248 B1 | 5/2003 | Ahn et al. | |
| 6,600,222 B1 | 7/2003 | Levardo | |
| 6,607,938 B2 | 8/2003 | Kwon et al. | |
| 6,661,085 B2 | 12/2003 | Kellar et al. | |
| 6,762,076 B2 | 7/2004 | Kim et al. | |
| 6,790,748 B2 | 9/2004 | Kim et al. | |
| 6,831,236 B2 | 12/2004 | Higuchi et al. | |
| 6,885,260 B2 * | 4/2005 | Nishimura et al. | 333/133 |
| 6,887,769 B2 | 5/2005 | Kellar et al. | |
| 6,908,565 B2 | 6/2005 | Kim et al. | |
| 6,908,785 B2 | 6/2005 | Kim | |
| 6,914,199 B2 | 7/2005 | Higuchi et al. | |
| 6,924,551 B2 | 8/2005 | Rumer et al. | |
| 6,943,067 B2 | 9/2005 | Greenlaw | |
| 6,946,384 B2 | 9/2005 | Kloster et al. | |
| 6,975,016 B2 | 12/2005 | Kellar et al. | |
| 6,995,049 B2 | 2/2006 | Takahashi | |
| 7,019,404 B2 | 3/2006 | Rokugawa et al. | |
| 7,037,804 B2 | 5/2006 | Kellar et al. | |
| 7,056,807 B2 | 6/2006 | Kellar et al. | |
| 7,087,538 B2 | 8/2006 | Staines et al. | |
| 7,151,009 B2 | 12/2006 | Kim et al. | |
| 7,157,787 B2 | 1/2007 | Kim et al. | |
| 7,215,033 B2 | 5/2007 | Lee et al. | |
| 7,276,799 B2 | 10/2007 | Lee et al. | |
| 7,279,795 B2 | 10/2007 | Periaman et al. | |
| 7,307,005 B2 | 12/2007 | Kobrinsky et al. | |
| 7,317,256 B2 | 1/2008 | Williams et al. | |
| 7,320,928 B2 | 1/2008 | Kloster et al. | |
| 7,345,350 B2 | 3/2008 | Sinha | |
| 7,402,442 B2 | 7/2008 | Condorelli et al. | |
| 7,402,515 B2 | 7/2008 | Arana et al. | |
| 7,410,884 B2 | 8/2008 | Ramanathan et al. | |
| 7,432,592 B2 | 10/2008 | Shi et al. | |
| 7,494,845 B2 | 2/2009 | Hwang et al. | |
| 7,528,494 B2 | 5/2009 | Furukawa et al. | |
| 7,531,890 B2 | 5/2009 | Kim | |
| 7,557,597 B2 | 7/2009 | Anderson et al. | |
| 7,576,435 B2 | 8/2009 | Chao | |
| 7,834,450 B2 | 11/2010 | Kang | |
| 2002/0180029 A1 | 12/2002 | Higashitani et al. | |
| 2004/0191497 A1 | 9/2004 | Hiraoka et al. | |
| 2005/0155791 A1 | 7/2005 | Saiki | |
| 2006/0037193 A1 | 2/2006 | Enomoto et al. | |
| 2006/0057340 A1 | 3/2006 | Umeda et al. | |
| 2006/0097379 A1 * | 5/2006 | Wang | 257/701 |
| 2007/0138644 A1 | 6/2007 | McWilliams et al. | |
| 2008/0251494 A1 | 10/2008 | Park et al. | |
| 2008/0303154 A1 | 12/2008 | Huang et al. | |
| 2010/0236698 A1 | 9/2010 | Sekimoto | |
| 2011/0068466 A1 | 3/2011 | Chen et al. | |

OTHER PUBLICATIONS

Conventional Process Flow, 1 page.
Conventional Structures, 1 pg.

* cited by examiner

FORMING INTERCONNECT STRUCTURES USING PRE-INK-PRINTED SHEETS

PRIORITY CLAIM AND CROSS-REFERENCE

This application is a divisional of U.S. patent application Ser. No. 12/778,867, filed on May 12, 2010, and entitled "Forming Interconnect Structures Using Pre-Ink-Printed Sheets," which application is hereby incorporated herein by reference.

BACKGROUND

This disclosure relates generally to integrated circuit structures, and more particularly to forming interconnect structures for integrated circuits using pre-ink-printed sheets.

Among the efforts for reducing the size of integrated circuits and reducing RC delay, three-dimensional integrated circuits (3DICs) and stacked dies are commonly used. Through-silicon vias (TSVs) are thus used in 3DICs and stacked dies. In this case, TSVs are often used to connect the integrated circuits on a die to the backside of the die. In addition, TSVs are also used to provide short grounding paths for grounding the integrated circuits through the backside of the die, which may be covered by a grounded metallic film.

TSV connections often require redistribution lines to be formed on the backside of wafers and connected to TSVs. Conventional backside TSV interconnections were formed using processes, such as chemical vapor deposition (CVD) methods, physical vapor deposition (PVD) methods, lithography processes, etching processes, and/or the like. These methods involve high costs. Further, these methods often require elevated temperatures of wafers, typically 200 to 400 degrees centigrade. Accordingly, thermally-induced stresses were introduced into the resulting wafers and chips and caused warpage of the wafers/chips. Furthermore, breaking of the dielectric layers and delamination between the dielectric layers in the wafers/chips may also occur.

BRIEF DESCRIPTION OF THE DRAWINGS

For a more complete understanding of the embodiments, and the advantages thereof, reference is now made to the following descriptions taken in conjunction with the accompanying drawings, in which.

DETAILED DESCRIPTION

The making and using of the embodiments of the disclosure are discussed in detail below. It should be appreciated, however, that the embodiments provide many applicable inventive concepts that can be embodied in a wide variety of specific contexts. The specific embodiments discussed are merely illustrative and do not limit the scope of the disclosure.

A novel interconnect structure, which may be connected to through-substrate vias (TSVs), and the method of forming the same are provided in accordance with an embodiment. The intermediate stages in the manufacturing of the embodiment are illustrated. The variations of the embodiment are discussed. Throughout the various views and illustrative embodiments, like reference numbers are used to designate like elements.

Figure 1:
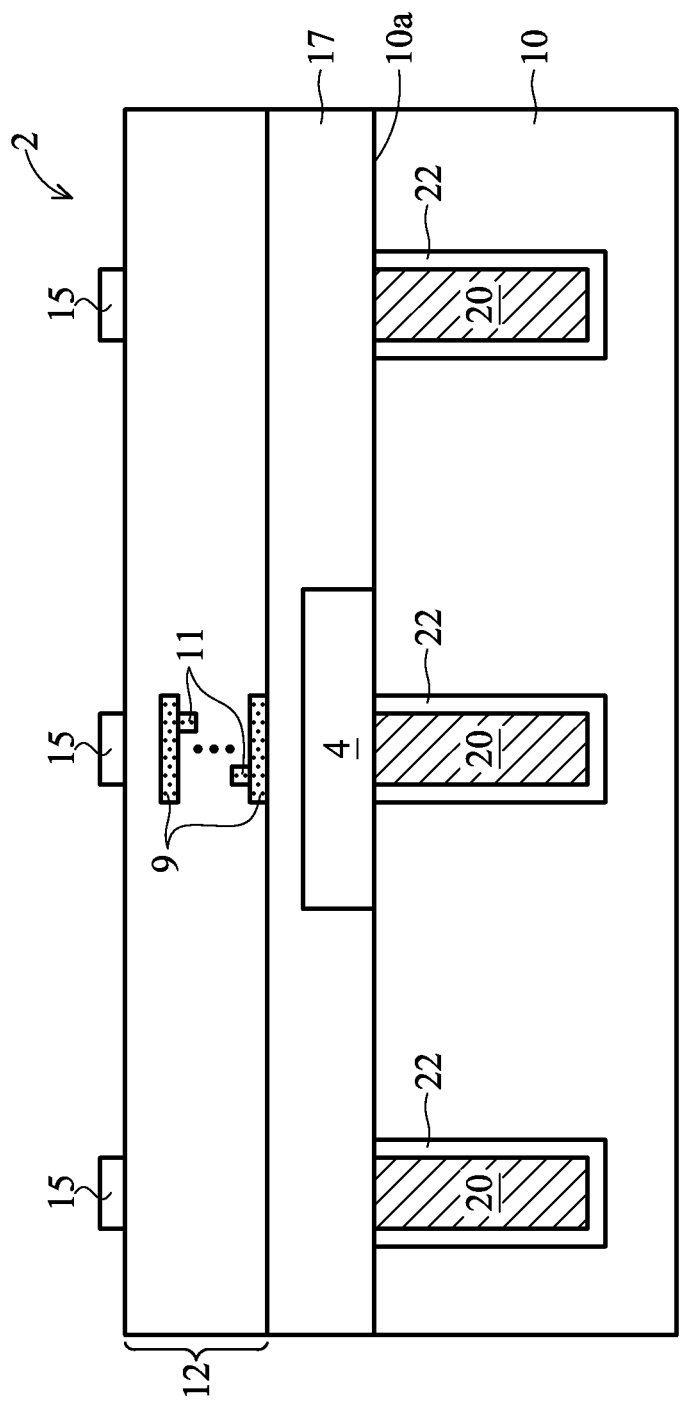
FIGS. 1 through 9 are cross-sectional views and a top view of intermediate stages in the manufacturing of an interconnect structure comprising pre-ink-printed redistribution lines in accordance with various embodiments.

Referring to FIG. 1, wafer 2, which includes substrate 10 and integrated circuits 4 therein, is provided. In accordance with various embodiments, wafer 2 is a device wafer comprising active integrated circuit devices, such as transistors. Substrate 10 may be a semiconductor substrate, such as a bulk silicon substrate, although it may include other semiconductor materials, such as silicon germanium, silicon carbide, gallium arsenide. Semiconductor devices such as transistors (also symbolized by block 14) may be formed at the front surface 10a of substrate 10. Interconnect structure 12, which includes metal lines 9 and vias 11 formed therein, is formed over substrate 10, with the metal lines and vias being electrically coupled to the semiconductor devices. Metal lines 9 and vias 11 may be formed of copper or copper alloys, and may be formed using the well-known damascene processes. Interconnect structure 12 may include commonly known inter-layer dielectrics (ILDs) and inter-metal dielectrics (IMDs). Metal bumps 15, which may be solder bumps or copper bumps, are formed on the front side (the side facing up in FIG. 1) of wafer 2, and protrudes beyond the front surface of wafer 2.

In alternative embodiments, wafer 2 is an interposer wafer, and is substantially free from integrated circuit devices including active devices, such as transistors and diodes, formed therein. Substrate 10 may be formed of a semiconductor material or a dielectric material, such as silicon oxide. Furthermore, interposer wafer 2 may include, or may be free from, passive devices, such as capacitors, resistors, inductors, varactors, or the like.

TSVs 20 are formed in substrate 10. In an embodiment, as shown in FIG. 1, TSVs 20 may be formed using a via-first approach, and may be formed before the formation of interconnect structure 12. Accordingly, TSVs 20 extend into the IMD layers in interconnect structure 12, and may, or may not, extend into ILD 17 that is used to cover the semiconductor devices. In alternative embodiments (not shown), TSVs 20 are formed using a via-last approach, and are formed after the formation of interconnect structure 12. Accordingly, TSVs 20 penetrate through interconnect structure 12. Isolation layers 22 are formed on the sidewalls of TSVs 20, and electrically insulate TSVs 20 from substrate 10. Isolation layers 22 may be formed of commonly used dielectric materials, such as silicon nitride, silicon oxide (for example, tetra-ethyl-ortho-silicate (TEOS) oxide), and the like.

Figure 2:
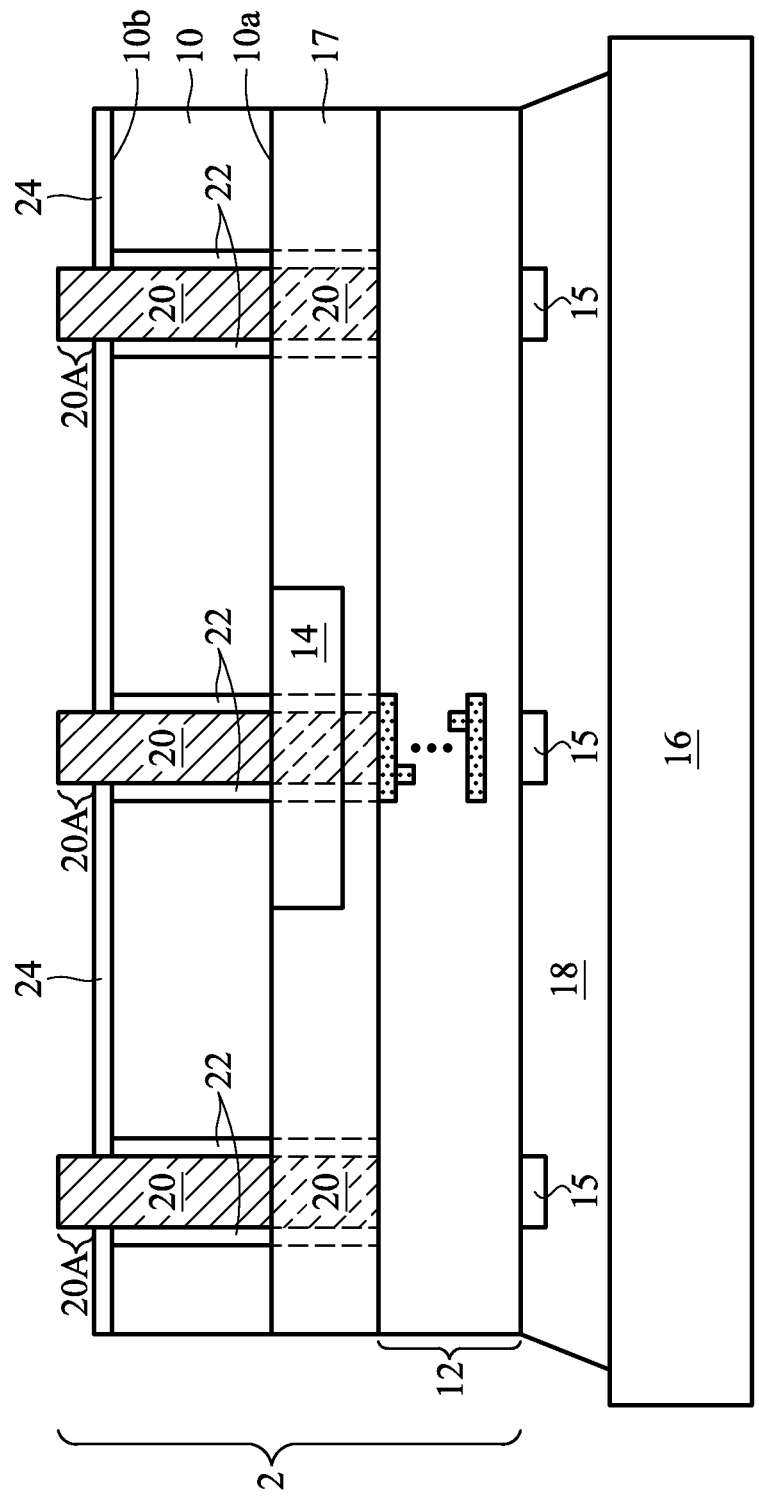

Referring to FIG. 2, wafer 2 is bonded onto carrier 16 through glue 18, and a backside grinding is performed to remove an excess portion of substrate 10. For example, a chemical mechanical polish (CMP) is performed to the backside of substrate 10, so that TSVs 20 are exposed. Backside insulation layer 24 is formed to cover the backside of substrate 10. In an exemplary embodiment, the formation of backside insulation layer 24 includes etching back surface 10b of substrate 10, blanket forming backside insulation layer 24, and performing a light CMP to remove the portion of backside insulation layer 24 directly over TSVs 20. Accordingly, TSVs 20 are exposed through backside insulation layer 24. In alternative embodiments, the openings in backside insulation layer 24, through which TSVs 20 are exposed, are formed by etching. In the resulting structure, TSVs 20 include TSV bumps 20A, which are portions of TSVs 20 protruding out of the back surface of wafer 2.

Figure 3A:
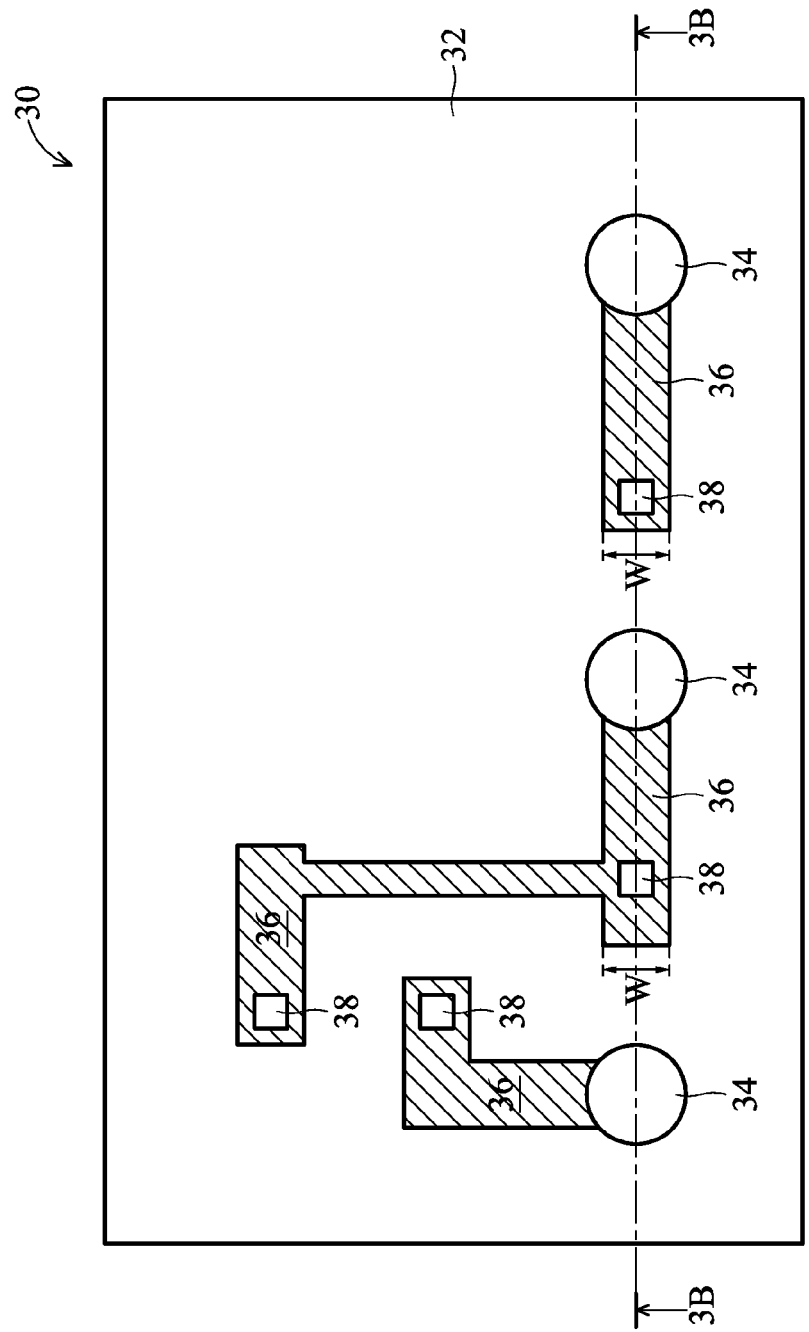
Figure 3B:
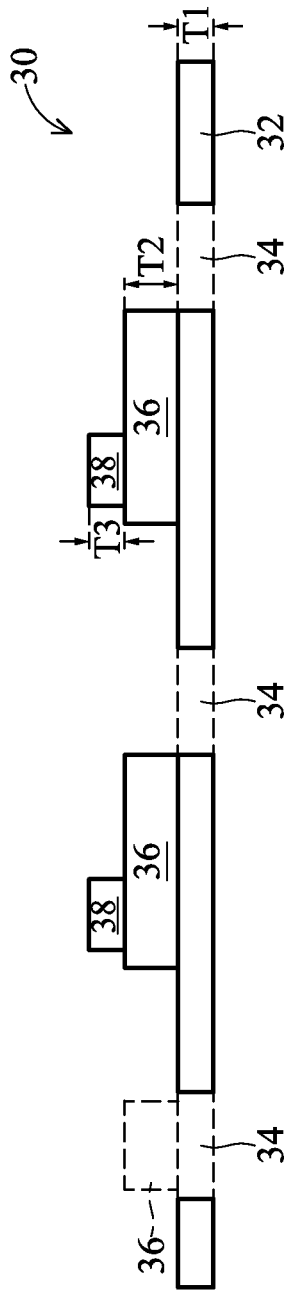

FIGS. 3A and 3B are a top view and a cross-sectional view of pre-ink-printed sheet 30, wherein the cross-sectional view shown in FIG. 3B is obtained from the plane crossing line 3B-3B in FIG. 3A. In an embodiment for forming pre-ink-printed sheet 30, dielectric sheet 32 is provided. Dielectric sheet 32 may have a size matching the size of wafer 2. The thickness T1 (FIG. 3B) of dielectric sheet 32 may be between about 1 μm and about 100 μm, for example. It is realized, however, that the dimensions recited throughout the description are merely examples, and may be changed. In an embodiment, dielectric layer 32 is formed of polyimide, although other dielectric materials, such as BCB, Phenol, Epoxy, or the like may also be used. Through-holes 34, which extend from one side of dielectric layer 32 to the opposite side, are formed at desirable positions of dielectric layer 32. Although the illustrated through-holes 34 are circular, they may also have other shapes, such as square, hexagon, or the like. The size of through-holes 34 is slightly greater than TSV bumps 20A as in FIG. 2.

Conductive lines (also referred to as redistribution lines (RDLs) hereinafter) 36 are printed on dielectric layer 32 using ink-printing, wherein the ink may be a conductive paste, such as a silver paste, a copper paste, or the like. The ink-printing may be performed using, for example, a nano silver ink printer. Some of RDLs 36 extend to the edges of through-holes 34. In an embodiment, the width W of RDLs 36 may be greater than about 10 μm, or even greater than about 14 μm, while thickness T2 of RDLs 36 may be less than about 2 μm, although different thicknesses and widths may be used, depending on the capability of the ink-printer. If thicker RDLs 36 are desirable, repeated printing may be performed, with each of the printings resulting in the increase in the thickness T2 of RDLs 36.

Besides RDLs 36, vias 38 may also be formed. Throughout the description, RDLs and vias are also referred to as conductive patterns. In an embodiment, vias 38 are also formed by ink-printing. Referring to FIG. 3B, the formation of vias 38 includes repeated printing of the conductive paste onto RDLs 36, until thickness T3 of vias 38 reaches desirable values, for example, greater than about 1 μm. In alternative embodiments, no vias 38 are formed. The printing of RDLs 36 and vias 38 may be performed in a same printing step.

Figure 4:
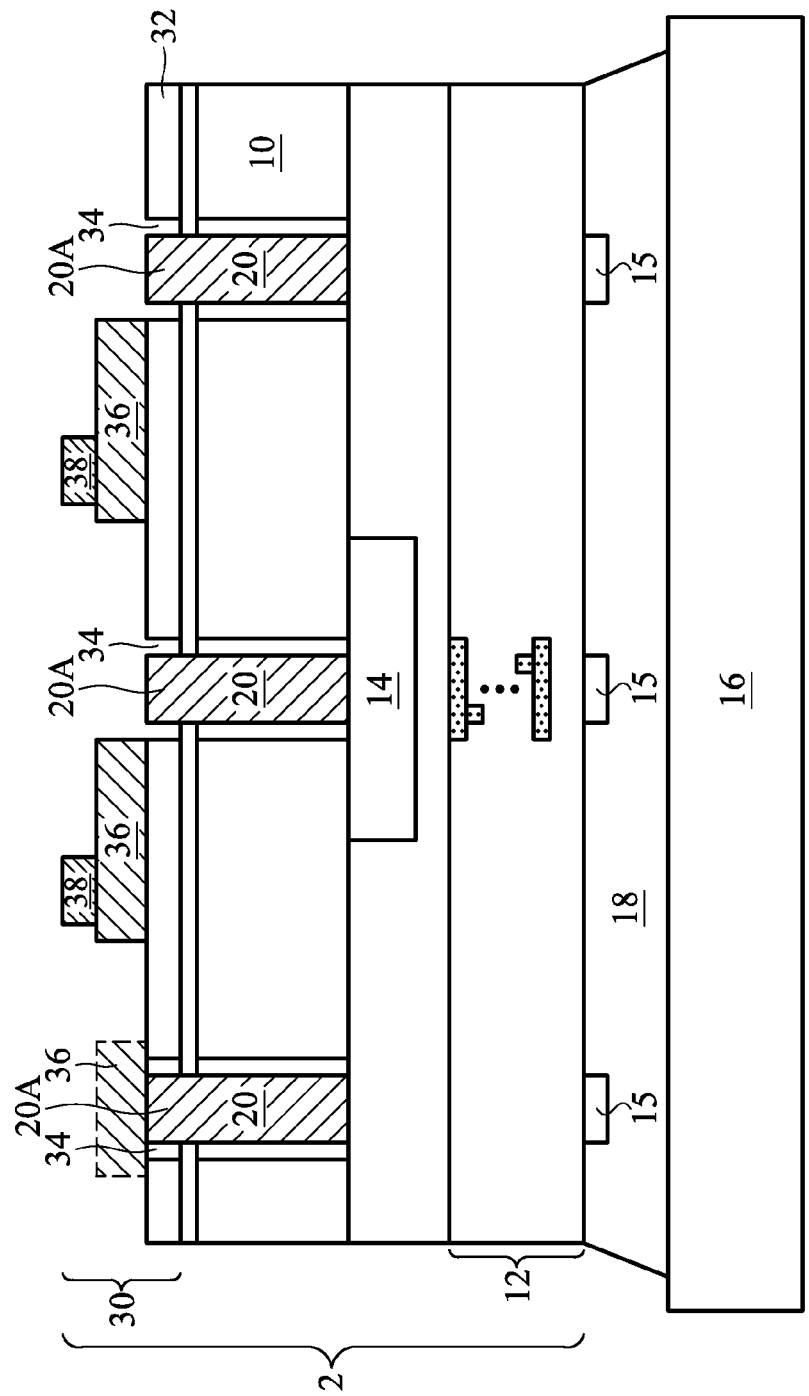
Figure 5:
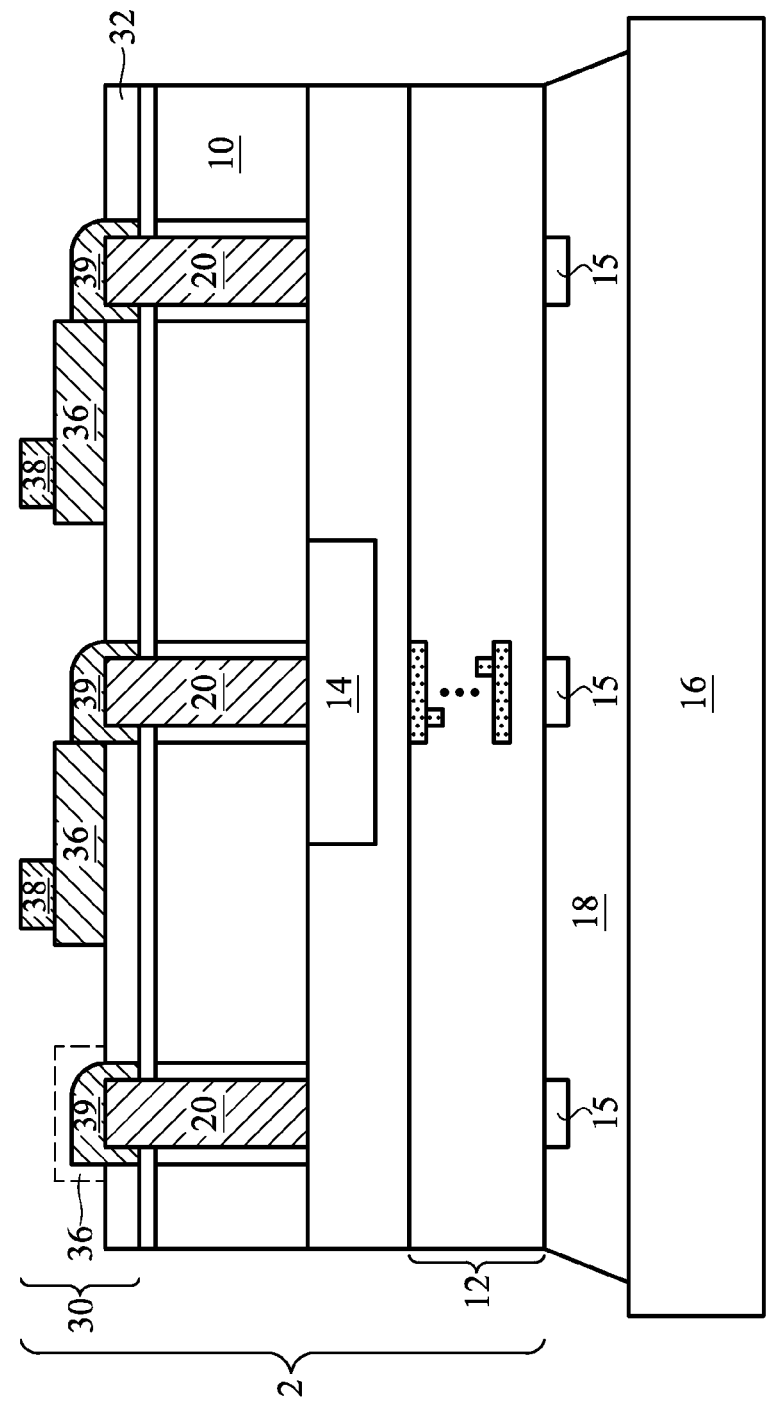

Referring to FIG. 4, after the formation of pre-ink-printed sheet 30, pre-ink-printed sheet 30 is laminated onto the backside of wafer 2. Dielectric layer 32 may be laminated (bonded) to the backside of wafer 2 through a thin glue layer (not shown) or by heating wafer 2 so that dielectric layer 32 (for example, a polyimide layer) adheres to wafer 2. An alignment is performed so that TSV bumps 20A extend into through-holes 34. Next, as shown in FIG. 5, conductive paste 39, which may also be a silver paste, a copper paste, or the like, is filled into through-holes 34, and to electrically couple TSVs 20 to RDLs 36.

Figure 6:
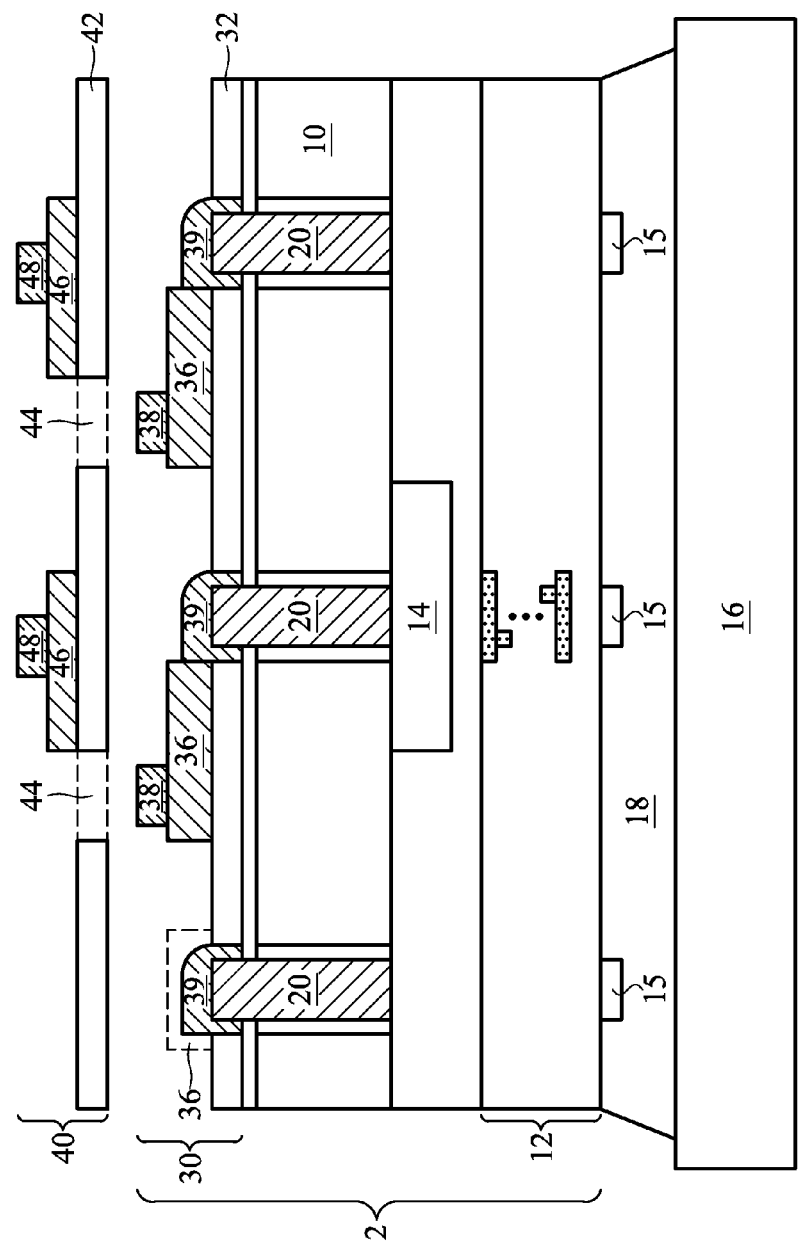
Figure 7:
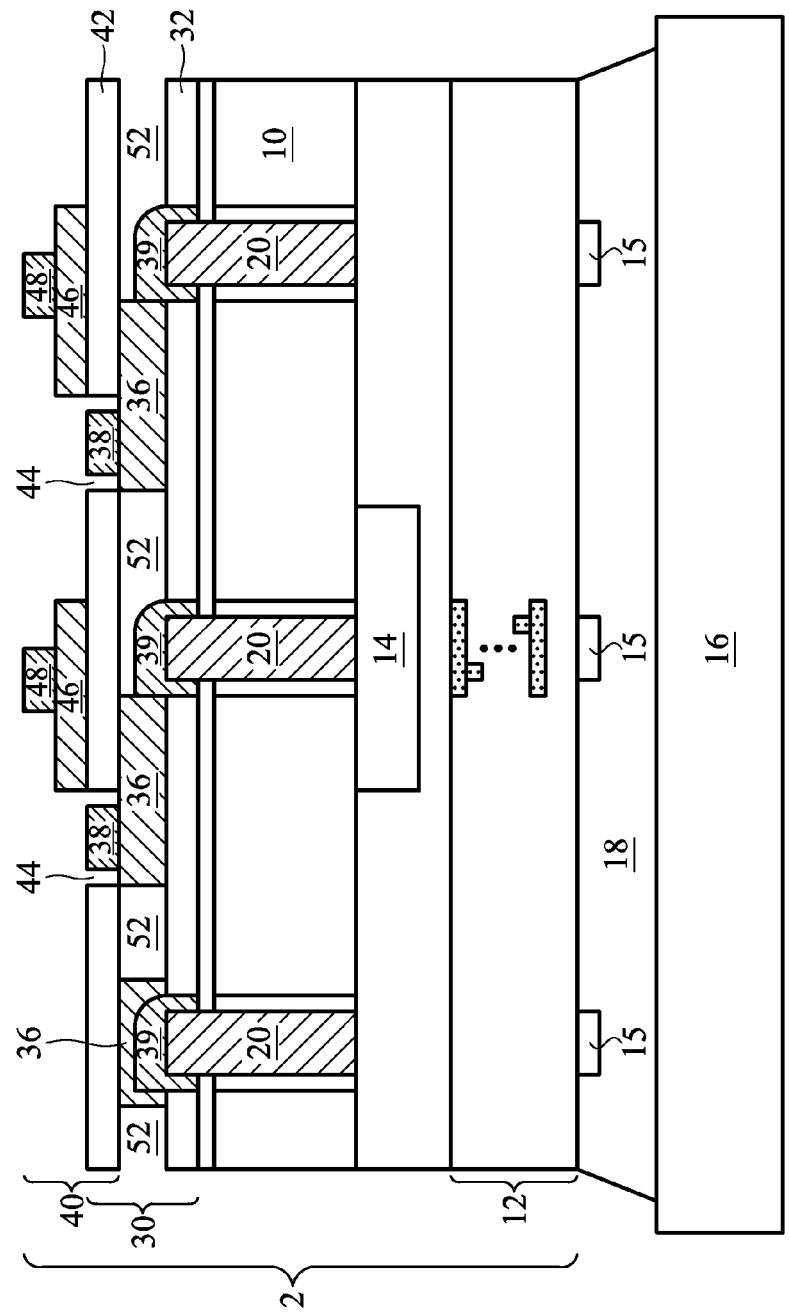
Figure 8:
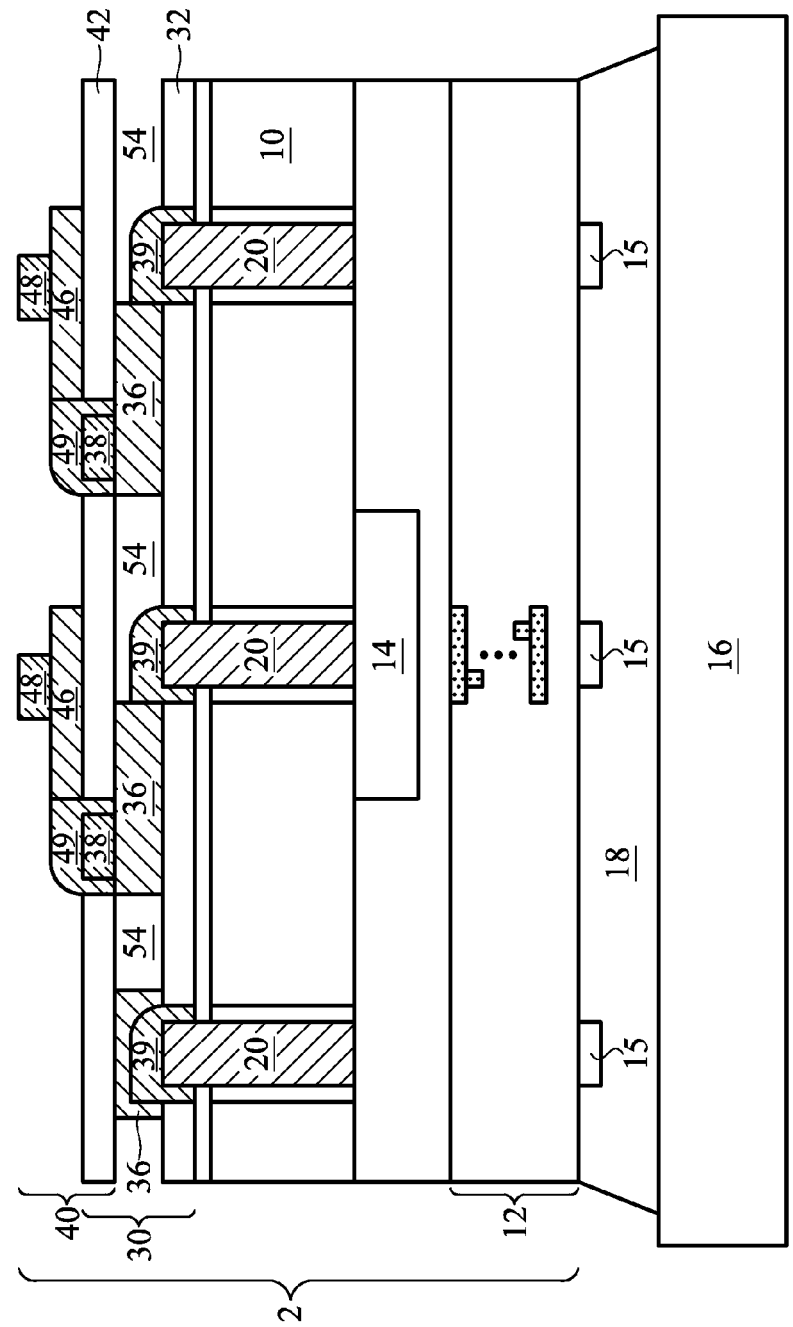

FIGS. 6 through 8 illustrate the formation and the bonding of pre-ink-printed sheet 40. Referring to FIG. 6, pre-ink-printed sheet 40 is pre-formed, for example, using essentially the same methods as forming pre-ink-printed sheet 30. Pre-ink-printed sheet 40 comprises dielectric sheet 42, on which RDLs 46 and vias 48 are formed using ink-printing. The patterns of through-holes 44, RDLs 46, and vias 48 in pre-ink-printed sheet 40 may be different from that of respective through-holes 34, RDLs 36, and vias 38. Further, the locations of through-holes 44 correspond to the locations of vias 38, and the size of through-holes 44 are slightly greater than that of vias 38 so that vias 38 may fit in through-holes 44.

Referring to FIG. 7, pre-ink-printed sheet 40 is placed on, aligned to, and laminated (bonded) onto pre-ink-printed sheet 30. Vias 38 extend into through-holes 44. Next, as shown in FIG. 8, conductive paste 49 is filled into the remaining spaces of through-holes 44, and electrically couples vias 38 to RDLs 44. In the embodiments wherein no vias 38 are formed on pre-ink-printed sheet 30, conductive paste 39 fills the entireties of through-holes 44, and electrically couples RDLs 36 to RDLs 46.

FIG. 7 illustrates that gaps 52 may exist between pre-ink-printed sheets 30 and 40. As shown in FIG. 8, gaps 52 may be filled with filling dielectric material 54, which may be an epoxy. In alternative embodiments, filling dielectric material 54 may be applied onto pre-ink-printed sheet 30 after the structure as shown in FIG. 5 is formed, but before pre-ink-printed sheet 40 is laminated onto pre-ink-printed sheet 30.

Figure 9:
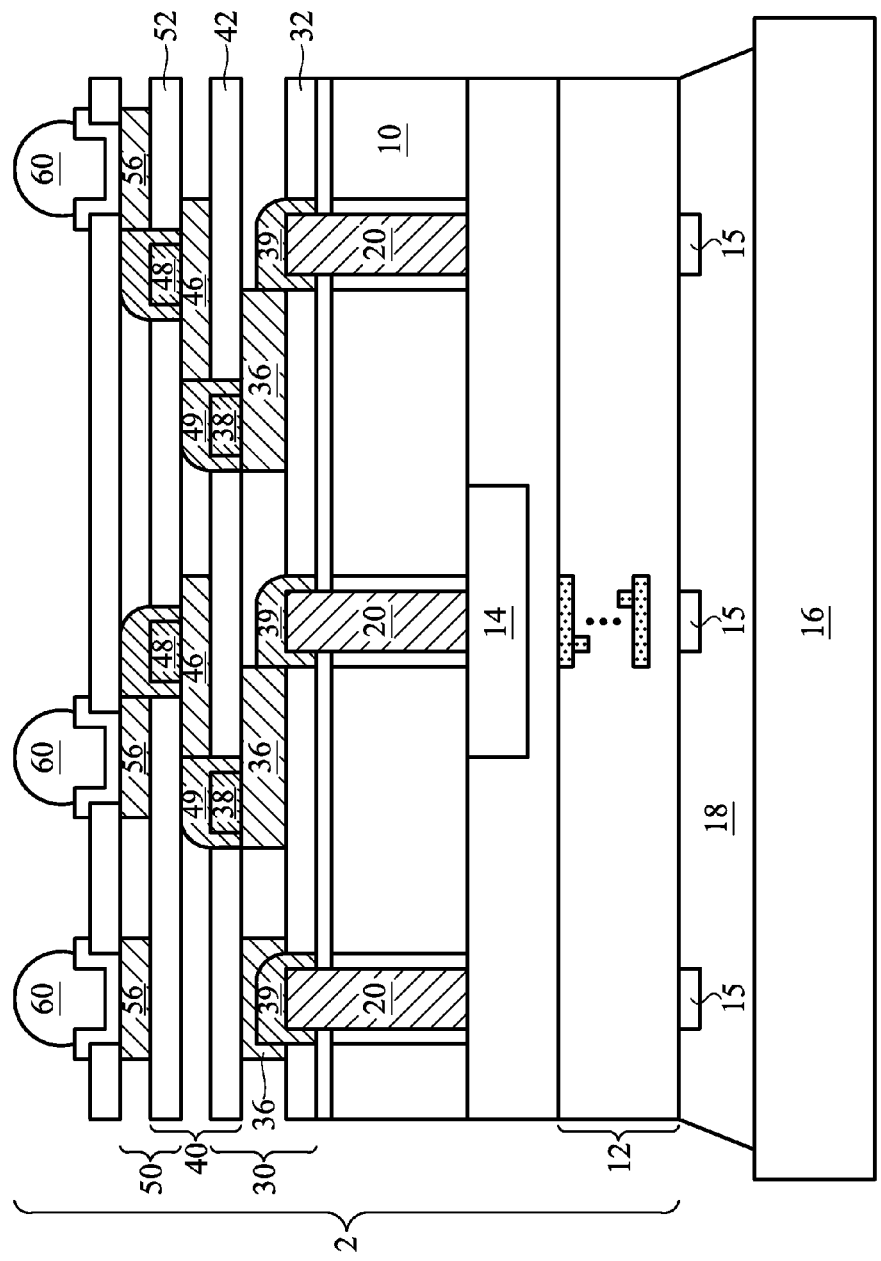

After the bonding of pre-ink-printed sheet 40, additional pre-ink-printed sheets may be bonded to form multi-layer RDLs. As shown in FIG. 9, pre-ink-printed sheet 50, which includes additional RDLs 56, is pre-formed and then bonded onto pre-ink-printed sheet 40. Bumps 60 may then be formed. Bumps 60 may be solder bumps, copper bumps (which may be coated with nickel layers, gold layers, or the like) may then be formed.

Figure 10:
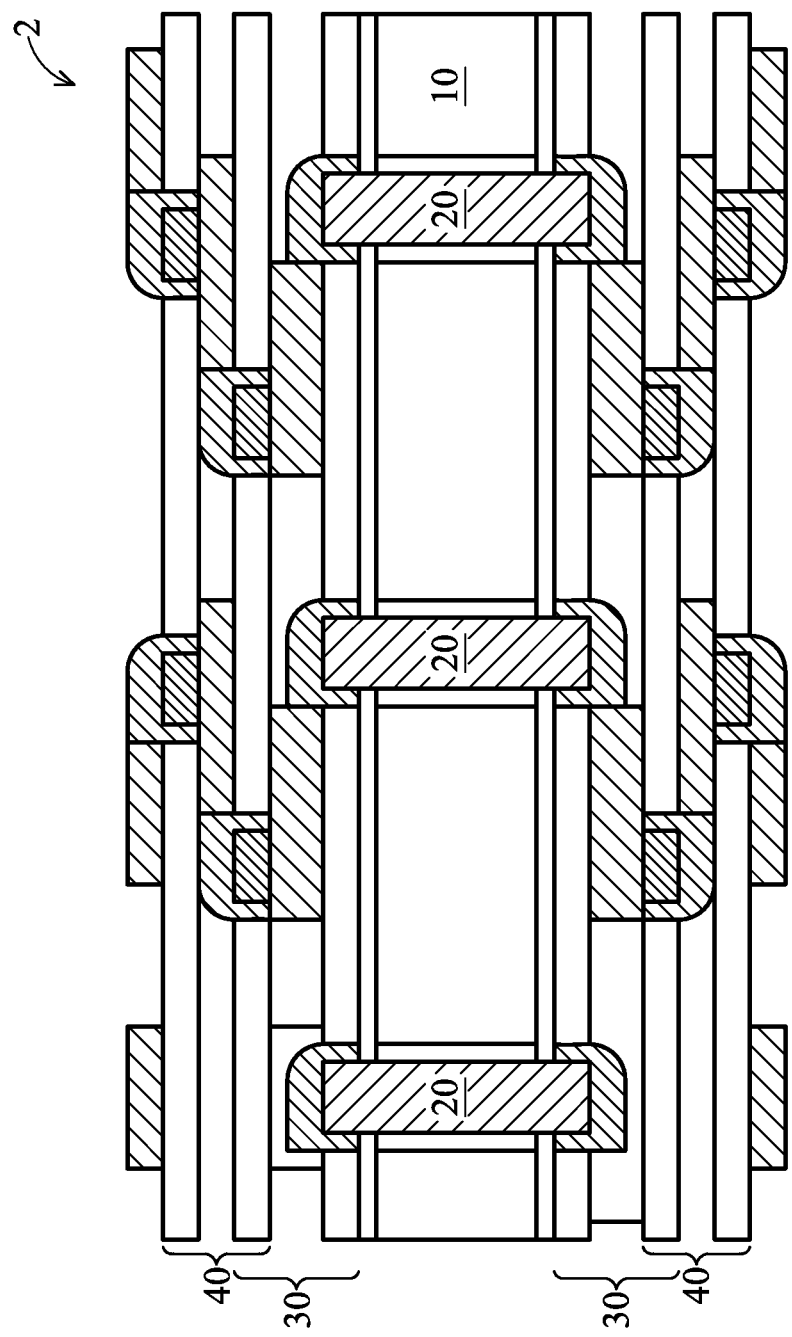
FIG. 10 illustrates the cross-sectional view of an interposer in accordance with alternative embodiments, wherein the interconnect structures on opposite sides of the interposer comprise pre-ink-printed redistribution lines.

FIGS. 1 through 8 illustrate the formation of backside interconnect structure for a device wafer comprising TSVs. In alternative embodiments, the teaching of the present disclosure is readily applicable to the formation of interconnect structures on one side, or both sides, of interposer wafers, which do not have active devices, such as transistors therein. A cross-sectional view of an exemplary embodiment is shown in FIG. 10. It is observed that the interconnect structures on both sides of interposer wafer 2 may be formed using pre-ink-printed sheets.

In the embodiments, the interconnect structures and the respective RDLs are formed using pre-ink-printed sheets. Therefore, the high-cost processes, such as chemical vapor deposition (CVD) methods, physical vapor deposition (PVD) methods, lithography processes, etching processes, and the like, are avoided. Further, the formation processes of the embodiments are substantially free from high-temperature processes, and hence substantially no thermally-induced stresses are introduced into the resulting wafers and dies as a result of the formation of interconnect structures.

Although the embodiments and their advantages have been described in detail, it should be understood that various changes, substitutions, and alterations can be made herein without departing from the spirit and scope of the embodiments as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure, processes, machines, manufacture, compositions of matter, means, methods, or steps, presently existing or later to be developed, that perform substantially the same function or achieve substantially the same result as the corresponding embodiments described herein may be utilized according to the disclosure. Accordingly, the appended claims are intended to include within their scope such processes, machines, manufacture, compositions of matter, means, methods, or steps. In addition, each claim constitutes a separate embodiment, and the combination of various claims and embodiments are within the scope of the disclosure.

In accordance with one aspect, a method of forming a device includes printing conductive patterns on a dielectric sheet to form a pre-ink-printed sheet, and bonding the pre-ink-printed sheet onto a side of a substrate. The conductive feature includes a through-substrate via extending from a first major side of the substrate to a second major side of the substrate opposite the first major side. A conductive paste is then applied to electrically couple conductive patterns to a conductive feature in the substrate.

Other embodiments are also disclosed.

What is claimed is:

1. A device comprising:
a substrate comprising a through-substrate via (TSV) extending from a first side of the substrate to a second side of the substrate opposite the first side;
a first dielectric sheet over the substrate, the first dielectric sheet comprising a first through-hole, wherein a portion of the TSV protrudes into the first through-hole and is spaced apart from sidewalls of the first through-hole;
a first redistribution line over the first dielectric sheet, wherein no portion of the first redistribution line overlaps the TSV, and wherein the first redistribution line is formed of an ink, and is electrically coupled to the TSV; and
an insulation layer disposed between the first dielectric sheet and the substrate, wherein the insulation layer physically contacts sidewalls of the TSV.

2. The device of claim 1 further comprising a conductive paste filling a portion of the first. through-hole, wherein a portion of the conductive paste is disposed between the sidewalls of the first through-hole and sidewalls of the TSV.

3. The device of claim 1, further comprising:
a plurality of second dielectric sheets disposed over and bonded to the first dielectric sheet, each of the plurality of second dielectric sheets having a second through-hole;
a plurality of second redistribution lines, each of the plurality of second redistribution lines printed on a respective one of the plurality of second dielectric sheets; and
a plurality of a second conductive materials, each of the plurality of second conductive materials electrically coupling the second redistribution line of a respective one of the plurality of second dielectric sheets to a second redistribution line of an adjacent dielectric sheet.

4. The device of claim 3, further comprising:
a conductive bump formed on a topmost pattern of the plurality of second redistribution lines.

5. A device, comprising:
a substrate having a through-substrate via (TSV) extending through a first side of the substrate to a second side of the substrate opposite the first side;
a first dielectric sheet having a first through-hole with a size greater than the size of a top portion of the TSV, wherein the first dielectric sheet is bonded to the first side of the substrate, wherein the TSV extends into the first through-hole without extending laterally over the first side of the substrate, and wherein the top portion of the TSV fits into the first through-hole;
an insulation layer between the first dielectric sheet and the substrate, wherein the insulation layer physically contacts sidewalls of the TSV;
first conductive patterns printed on a side of the first dielectric sheet facing away from the insulation layer, the first conductive patterns comprising a conductive ink, wherein no portion of the first conductive patterns overlaps the TSV; and
a first conductive material disposed over the first through-hole and over a portion of the TSV in the through-hole, wherein a portion of the first conductive material extends above the first through-hole, and no portion of the first conductive material covers a surface of the first conductive patterns facing away from the first dielectric sheet, the first conductive material electrically coupling the first conductive patterns to the TSV.

6. The device of claim 5, wherein the ink is a conductive paste that is a copper paste or a silver paste.

7. The device of claim 5, wherein the first conductive patterns have a first portion extending to an edge of the first through-hole.

8. The device of claim 5, wherein the first conductive material extends into the first through-hole between a sidewall of the first through-hole and a sidewall of the TSV.

9. The device of claim 8, further comprising:
a second dielectric sheet disposed over and bonded to the first dielectric sheet and having a second through-hole;
second conductive patterns printed on the second dielectric sheet; and
a second conductive material electrically coupling the second conductive patterns to the first conductive patterns through the second through-hole.

10. The device of claim 9, wherein the first conductive pattern comprises an RDL and a via; and
wherein the via is disposed on the RDL and extends into the second through-hole, the second conductive material contacting the via.

11. The device of claim 10, wherein the second through-hole is laterally spaced part from the first through-hole; and
wherein a portion of the first conductive pattern extends from the edge of the first through-hole to under the second through-hole.

12. The device of claim 9, wherein the second dielectric sheet is spaced apart from the first dielectric sheet by a gap, a bottom surface of the second dielectric sheet in contact with top surfaces of the first conductive patterns.

13. A device, comprising:
a substrate having a through-substrate via (TSV) extending through a first side of the substrate to a second side of the substrate opposite the first side, a TSV bump of the TSV extending above the first side of the substrate, the TSV bump having a width substantially equal to the TSV;
a plurality of dielectric sheets, each of the plurality of dielectric sheets having a through-hole, the plurality of dielectric sheets stacked over and bonded to the first side of the substrate by an insulating layer disposed between the substrate and the plurality of dielectric sheets, wherein the insulating layer physically contacts sidewalls of the TSV, wherein the TSV bump further extends above the insulating layer, wherein a first through-hole of a bottommost dielectric sheet of the plurality of dielectric sheets has a size greater than the size of the TSV bump, wherein the TSV bump extends into the first through-hole without extending laterally over the first side of the substrate;
a plurality of conductive patterns formed from a conductive ink, each of the plurality of conductive patterns printed on a respective sheet of the plurality of dielectric sheets; and
a plurality of conductive materials, each of the plurality of conductive materials disposed over a through-hole of a respective sheet of the plurality of dielectric sheets and electrically connecting a conductive pattern of the respective sheet to one of a conductive pattern of an adjacent one of the plurality of dielectric sheets or to the TSV bump, wherein no portion of the plurality of conductive materials is disposed over a surface of a respective conductive pattern facing away from a respective dielectric sheet.

14. The device of claim 13, further comprising:
a conductive bump formed on a topmost one of the plurality of conductive patterns.

15. The device of claim 13, wherein each of plurality of the conductive patterns below a topmost one of the plurality of conductive patterns comprises an RDL and a via; and wherein the via is disposed on the RDL, the via of each of the plurality of conductive patterns extend into the through-hole of an adjacent one of the dielectric sheets.

16. The device of claim 15, wherein each of the plurality of conductive materials extends into the through-hole of the respective sheet and contacts a sidewall of the through-hole.

17. The device of claim 13, wherein adjacent sheets of the plurality of dielectric sheets are spaced apart by a gap; and wherein a conductive pattern of one of the adjacent sheets is disposed between the adjacent sheets in the gap.

18. The device of claim 17, wherein a dielectric epoxy is disposed in the gap.

19. The device of claim 13, wherein the ink is a copper paste or a silver paste.

\* \* \* \* \*